(12) United States Patent
Thompson et al.

(10) Patent No.: US 7,471,156 B2
(45) Date of Patent: Dec. 30, 2008

(54) AMPLIFIER CONTAINING PROGRAMMABLE IMPEDANCE FOR HARMONIC TERMINATION

(75) Inventors: Bruce M. Thompson, Boca Raton, FL (US); Robert E. Stengel, Pompano Beach, FL (US)

(73) Assignee: Motorola, Inc, Schaumburg, IL (US)

( * ) Notice: Subject to any disclaimer, the term of this patent is extended or adjusted under 35 U.S.C. 154(b) by 82 days.

(21) Appl. No.: 11/537,231

(22) Filed: Sep. 29, 2006

(65) Prior Publication Data

US 2008/0079496 A1 Apr. 3, 2008

(51) Int. Cl.
*H03F 3/45* (2006.01)
(52) U.S. Cl. ........................................ 330/301; 330/276
(58) Field of Classification Search ......... 330/301–302, 330/295, 124 R, 275, 276
See application file for complete search history.

(56) References Cited

U.S. PATENT DOCUMENTS

| 7,170,353 B2* | 1/2007 | Amano ........................ 330/295 |
| 7,251,292 B2* | 7/2007 | Kandiar ....................... 375/297 |
| 7,355,479 B2* | 4/2008 | Van Der Heijden ......... 330/292 |

\* cited by examiner

*Primary Examiner*—Robert Pascal
*Assistant Examiner*—Hieu P Nguyen

(57) ABSTRACT

An apparatus and method for eliminating unwanted signal power dissipation in balanced amplifier circuits and for prohibiting unwanted signal power from appearing at the balanced amplifier load is presented. Load impedances to the amplifier power output transistors are maintained very low at unwanted frequencies, and are at an operational impedance level at the fundamental frequency. An impedance network control concept is presented, which may be either manually or automatically implemented.

16 Claims, 3 Drawing Sheets

AMPLIFIER CONTAINING PROGRAMMABLE IMPEDANCE FOR HARMONIC TERMINATION

FIELD OF THE INVENTION

The present invention relates generally to broadband or frequency agile balanced amplifier harmonic elimination and efficiency enhancement.

BACKGROUND

Many balanced amplifiers allow for harmonic cancellation and significant reduction of the harmonic content in the output signal. However, common balanced amplifier techniques do not allow for significant recovery of that even harmonic energy which could result in a significant overall efficiency improvement. Furthermore, because this harmonic termination is programmable with amplifier frequency and other operating parameters, this energy recovery can be optimized dynamically.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
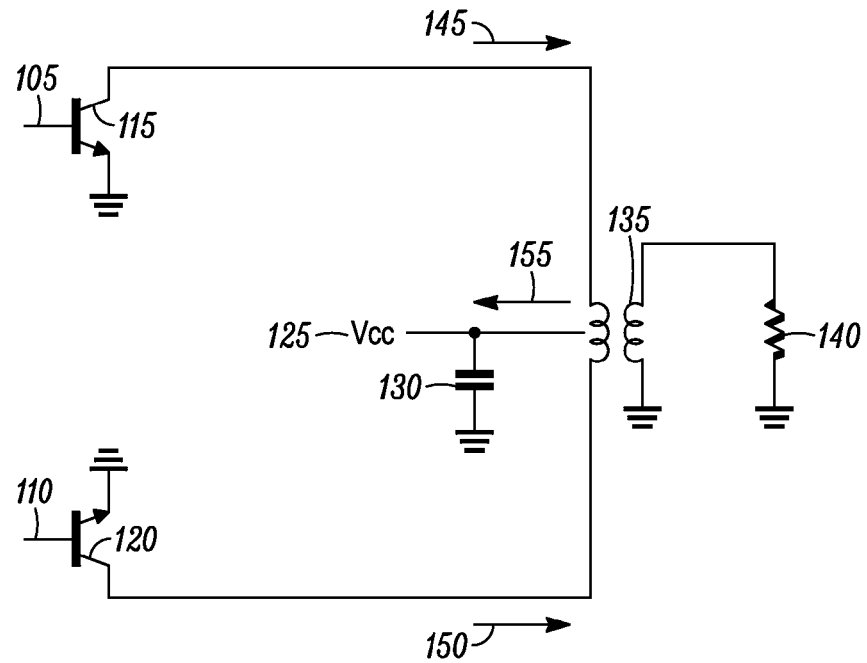
FIG. 1 is a schematic of a prior art balanced amplifier with output transformer primary center tap bypassed and used for supply delivery.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to the functions of the invention described herein. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

This invention enables balanced amplifiers to provide a controlled impedance termination to the power output transistors at unwanted signal frequencies and recover that energy for the desired signal thereby enhancing efficiency, in accordance with certain embodiments of the present invention. In accordance with certain embodiments of the invention, a method of enhancing efficiency of a balanced amplifier is disclosed, the method comprising: providing controlled impedance terminations within the balanced amplifier at one or more harmonic frequencies of a fundamental frequency that is operable to mitigate the presence of harmonic energy content in the output signal of the balanced amplifier; and reflecting the mitigated harmonic energy within the balanced amplifier, wherein the reflected harmonic energy is available for use by the balanced amplifier at the fundamental frequency and wherein the efficiency of the balanced amplifier is enhanced. In accordance with a balanced amplifier disclosed, the balanced amplifier comprises: a first input for receiving a first input signal; a second input for receiving a second input signal; a first active power device which amplifies first input signal; a second active power device which amplifies second input signal; a transformer primary which combines the output of first active power device and the output of second active power device, and having a transformer primary center tap; an impedance network coupled to the transformer primary center tap, wherein the impedance network is operable to modify the impedances provided to the outputs of the first and second active power devices.

Many variations, equivalents and permutations of these illustrative exemplary embodiments of the invention will occur to those skilled in the art upon consideration of the description that follows. The particular examples utilized should not be considered to define the scope of the invention. For example discrete circuitry implementations, integrated circuit implementations, and hybrid approaches thereof, may be formulated using techniques of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

This invention enables balanced amplifiers to provide a controlled programmable impedance termination to unwanted common mode signal frequencies and recover that energy for the desired signal thereby enhancing efficiency. These common mode signals can enter from previous stages, can arise from even order harmonics generated by internal amplifier or device non-linearities, through supply isolation issues or through the influence of external fields. There is the distinct possibility that a differential amplifier stage may have a signal with a strong common-mode component connected to its input. One frequently occurring example involves the even order distortion terms present at the output of a previous stage. Many conventional balanced amplifiers allow for even harmonic cancellation and significant reduction of the even harmonic content in the signal at the output. However, traditional balanced amplifier techniques do not allow for recovery of that even harmonic energy which could result in overall efficiency improvements. Furthermore, because this common mode harmonic termination is programmable with amplifier frequency and other operating parameters this energy recovery can be optimized dynamically or manually. Additionally, it may achieve this termination at the active device output terminals where the energy recovery from these common-mode signals is greatest.

It is important to note that the present invention has no theoretical restrictions on frequencies of operation.

Many variations, equivalents and permutations of these illustrative exemplary embodiments of the invention will occur to those skilled in the art upon consideration of the description that follows. The particular examples utilized should not be considered to define the scope of the invention. For example discrete circuitry implementations and integrated circuit implementations, and hybrid approaches thereof, may be formulated using circuit techniques of the present invention.

Conventional differential balanced amplifiers are comprised of two signal amplification paths driven out of phase with respect to each other and simultaneously feeding a combiner. This combiner frequently consists of a transformer or balun which sums these signals differentially. The natural phasing of even order harmonics makes them appear as common-mode signals, as compared to the desired fundamental signals that are being summed differentially. This entire system performs a vector addition of the powers while simultaneously providing the immunity to common mode interference that balanced systems are known for.

Systems of this type, employing the aforementioned output transformers, usually contain a center tap on the primary winding which is relegated to grounding, AC bypassing, or AC bypassing and DC supply delivery since this point in the circuit is a virtual ground for the differential mode signals. This point is however, not a virtual ground for common mode signals including even order harmonics. The center tap is essentially a common-mode access port. One possible embodiment of this invention, takes advantage of this center tap point to supply programmable common mode harmonic termination impedance that is transparent to the desired differential mode signals. This programmable common mode load can be tuned on the fly, for example, to deliver low impedance at the harmonic frequencies of interest thereby delivering a strong reflection of that harmonic energy back into the amplifier.

Fixed passive harmonic termination is a known efficiency enhancement technique for power amplifiers. This new approach makes possible a dynamically tunable termination at much lower power requirements, considering limited undesired mode conversion, and does so with little or no impact on the desired differential mode signals.

It should be understood that the simple grounding or AC bypassing of the center tap does not necessarily constitute low impedance termination of the even harmonics or allow for their complete reflection at the power device outputs. Only in a simplified ideal analysis, will grounding or AC grounding the center tap result in harmonic termination of the active device.

In a real application, components and connections have non-zero electrical lengths along with significant physical parasitics. In this case, a ground at the center tap does not mean necessarily low even harmonic impedances at the device collector or drain. A local ground or bypass to ground at the center tap can affect harmonic levels relative to the desired fundamental at the output, if the amplifier is not perfectly balanced. Indeed, this reduction in harmonic level is often mistaken for optimal harmonic reflection.

However, in order to get the full efficiency benefit of common-mode/even harmonic reflection, the low impedance must be presented as close as possible to the active device output terminals. It is understood that high impedance reflection may be utilized in a similar manner for odd-order harmonics. Certain embodiments of the invention provides for correct harmonic terminations at the device terminals in practical circuits by allowing for the selection of phase shifts/electrical delays at multiples of the desired fractional wavelength may be added to common mode load at will. This approach makes it possible to "electronically place" the desired termination at the active device output, to yield greatest reflection and hence the greatest improvement in efficiency available from this effect.

This invention may be applied wherever balanced power amplifiers, or differential power combining is used, especially where broad bandwidth and efficiency are requirements. Multi-band portable radios are logical applications. Applications where electronically reconfigurable amplifiers are necessary, such as software definable radio (SDR), are also well suited to application of this invention.

Refer to FIG. 1, which is a schematic 100 of a prior art balanced amplifier with output transformer primary center tap bypassed and used for supply delivery. Input 105 and Input 110 are differential inputs, and Transistor 115 and Transistor 120 are the corresponding active power devices. Transistor 115 and Transistor 120 are exemplary only, as the power stages and/or active devices utilized may be any selected by the electrical designer. The outputs of Transistor 115 and Transistor 120 are routed to the primary of Transformer 135, and the secondary of Transformer 135 drives Load 140. Vcc 125 is commonly supplied through the primary of Transformer 135 to the output power devices Transistor 115 and Transistor 120, as shown. Capacitor 130 is utilized to achieve a basic supply bypassing at the center tap of the primary of Transformer 135 for the fundamental frequency of interest, for example F. The bypass action of Capacitor 130 allows for the limited suppression and arbitrary termination of the common-mode signals present in the transformer primary at the center tap. This basic AC grounding of the center tap can not precisely achieve low even harmonic terminating impedance at the active device outputs 115 or 120. Energy at F1 and F2 will be dissipated in the resistive portion of components such as Transformer 135 and Capacitor 130, or will be delivered to Load 140. Energy dissipated at F1 and F2 reduces amplifier efficiency and outputs undesired signals.

Figure 2:
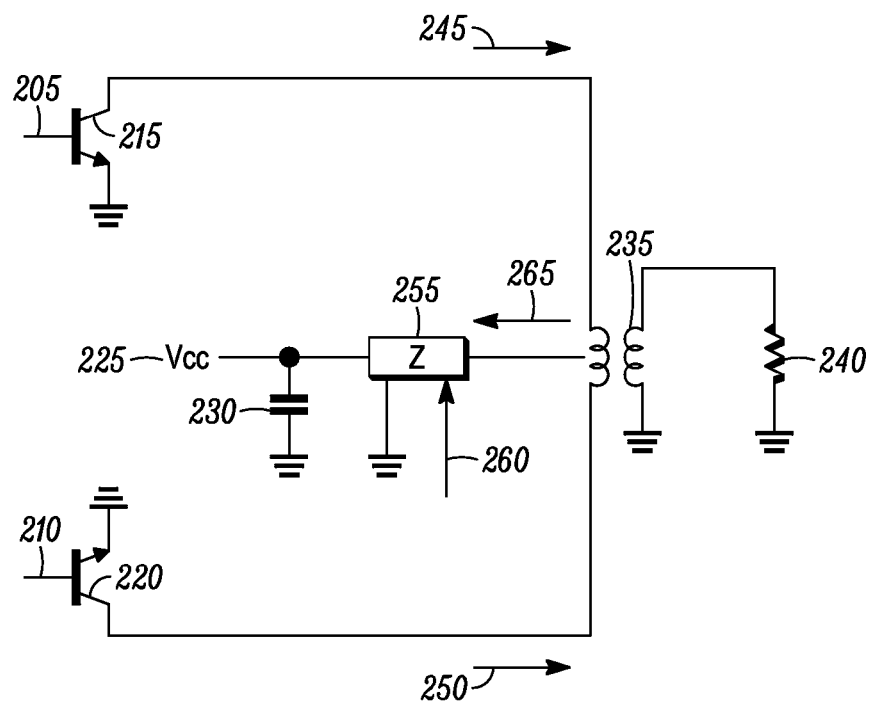
FIG. 2 is a schematic of a balanced amplifier with output transformer center tap connected to an impedance network, utilized in accordance with certain embodiments of the present invention.

Refer to FIG. 2, which is a schematic 200 of a balanced amplifier with output transformer center tap connected to an impedance network, utilized in accordance with certain embodiments of the present invention. Input 205 and Input 210 are differential inputs, and Transistor 215 and Transistor 220 are the corresponding active power devices. Transistor 215 and Transistor 220 are exemplary only, as the power stages utilized and device types may be any selected by the electrical designer. The outputs of Transistor 215 and Transistor 220 are routed to the primary of Transformer 235, and the secondary of Transformer 235 drives Load 240. Vcc 225 is commonly supplied through the primary of Transformer 235 to output power devices Transistor 215 and Transistor 220, as shown. Capacitor 230 is utilized to achieve additional supply bypassing if the optional supply delivery bias tee is included. Impedance Network 255 is utilized to provide certain impedances versus frequency, as seen in Direction 265. Impedance Network Control 260 provides for the change of network parameters in Impedance Network 255. For example, at frequency 2F, the second harmonic, the impedance in Direction 255 is selected to be essentially zero, with a specific frequency dependent offset phase length, by the designer. Refer to the previous discussion for FIG. 1. At fundamental frequency F the impedances seen in Direction 245 and Direction 250 are selected by the designer to be some known value, as they are the loads into which Transistor 215 and Transistor 220 will work. However, note that if there are higher common-mode frequencies of interest, for example the second harmonic 2F and the fourth harmonic 4F, the impedances seen in Directions 245 and 250 are usually non-zero and contain a resistive part. Common-mode energy cancelled or dissipated at the center tap for 2F and 4F etc reduces the output undesired signals but offers insignificant efficiency improvement as the exact even harmonic impedance at the device output terminals is unknown. To overcome this, Impedance Network 255 is designed to provide a value of impedance termination for even harmonics at the active device outputs by allowing particular phase shifts and/or electrical delays at multiples of the desired fractional wavelength which will result in the desired impedance for the total reflection of the even harmonic energy. It is then reflected back into the active device where it will become available for use at the desired fundamental frequency. Consequently there will be no power dissipated at 2F and 4F in the output components or in Load 240. The reflection of the energy of undesired frequencies 2F and 4F back into the power device to be reused and will not be output, and overall amplifier efficiency will be improved.

It should be noted that the above requirements for specific impedances at specific frequencies placed on Impedance Network 255 are well within the design techniques used in the industry for designing RF and Microwave electrical networks. As such, no further elaboration of Impedance Network 255 is presented here since for the purposes of the present invention details of the construction and topology of Impedance Network 255 are not relevant. In addition, Impedance Network 255 may contain any sort of circuit devices, both passive and active, as chosen by the designer.

Also note that frequencies 2F and 4F were examples of undesired frequencies, and that in applications utilizing this invention there may be greater or lesser numbers of undesired frequencies. Impedance Network 255 would then be designed to supply the impedances in Direction 265 which would cause the impedances in Direction 245 and Direction 250 to be zero at each undesired frequency.

Figure 3:
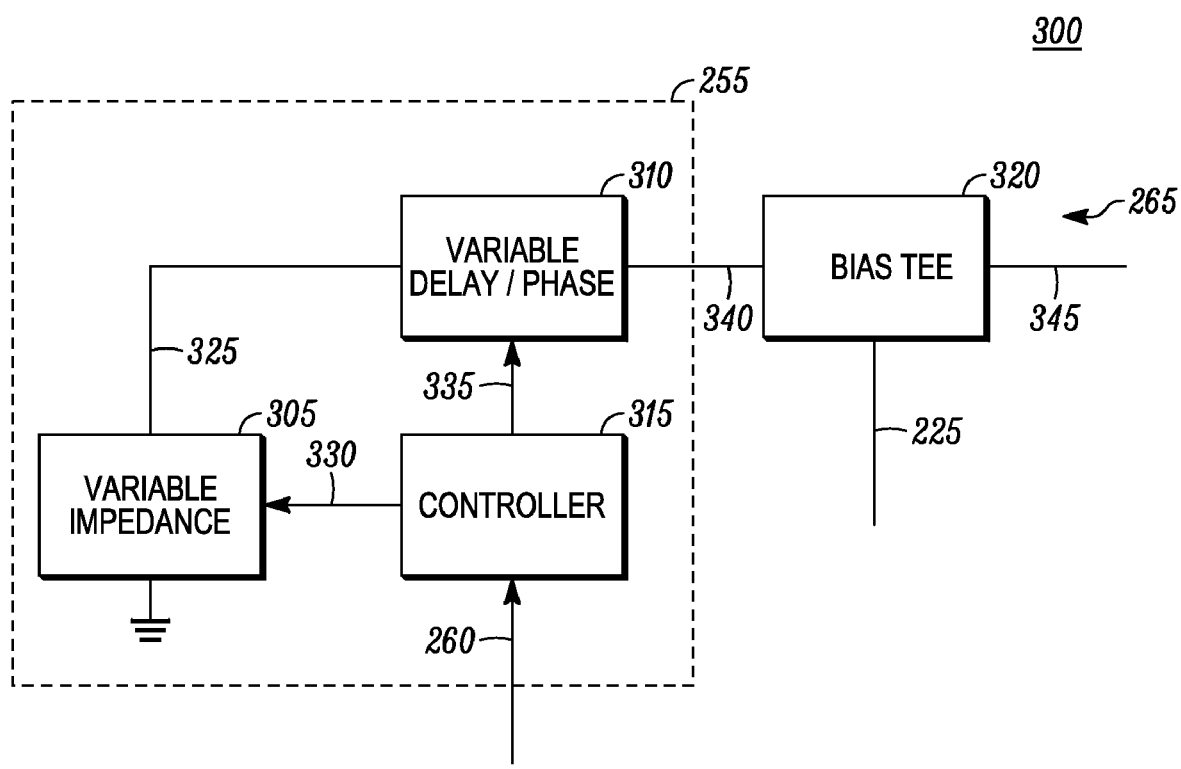
FIG. 3 is an exemplary block diagram of an impedance network, utilized in accordance with certain embodiments of the present invention.

Refer to FIG. 3, which is an exemplary block diagram 300 of an impedance network, utilized in accordance with certain embodiments of the present invention. The impedance presented to the transformer center tap in direction 265 is determined by the impedance presented by impedance network 255, between the bias tee input 340 and ground. This impedance is the sum of variable impedance 305 and variable delay/phase 310. Bias tee 320 is considered ideal, with zero impedance between bias tee input 340 and bias tee output 345 and infinite impedance between Vcc 225 and both bias tee input 340 and bias tee output 345. The transformer center tap is therefore presented with an impedance, and a DC component if required. If the DC power supply component is not required, bias tee 320 is not utilized. In either case the center tap signals travel through variable delay/phase 310 which adds electrical length on the way to variable impedance 305. Variable impedance 305 generates selected real and reactive impedance components. Using this approach a termination in direction 265 at the transformer center tap is reflected to the active device outputs and provides even harmonic termination by allowing particular phase shifts and/or electrical delays at multiples of the desired fractional wavelength of the even harmonic. The impedance produced by the variable impedance block can be delivered to the reference plane of the active device output terminals through the selection of the electrical phase length of the variable delay block. This results in the desired impedance for the total reflection of the even harmonic energy. It is then reflected back into the active device where it will become available for use at the desired fundamental frequency. Controller 315 is utilized to control the selection of components in variable impedance 305 and in variable delay/phase 310, which is shown by the routing of controller output 330 to variable impedance 305, and the routing of controller output 335 to variable delay/phase 310. Note that controller output 330 and controller output 335 may be any format required by control interface requirements of variable impedance 305 and variable delay/phase 310. In a similar manner, impedance network control 260 may be of any format, determined by system design specifications. Impedance network control 260 may be controlled manually or automatically, and may be part of a control loop (not shown) designed to provide specific impedance values in direction 265 or specific impedance values at the active device outputs, or both. Impedance network control 260 may be under software control or analog control.

Figure 4:
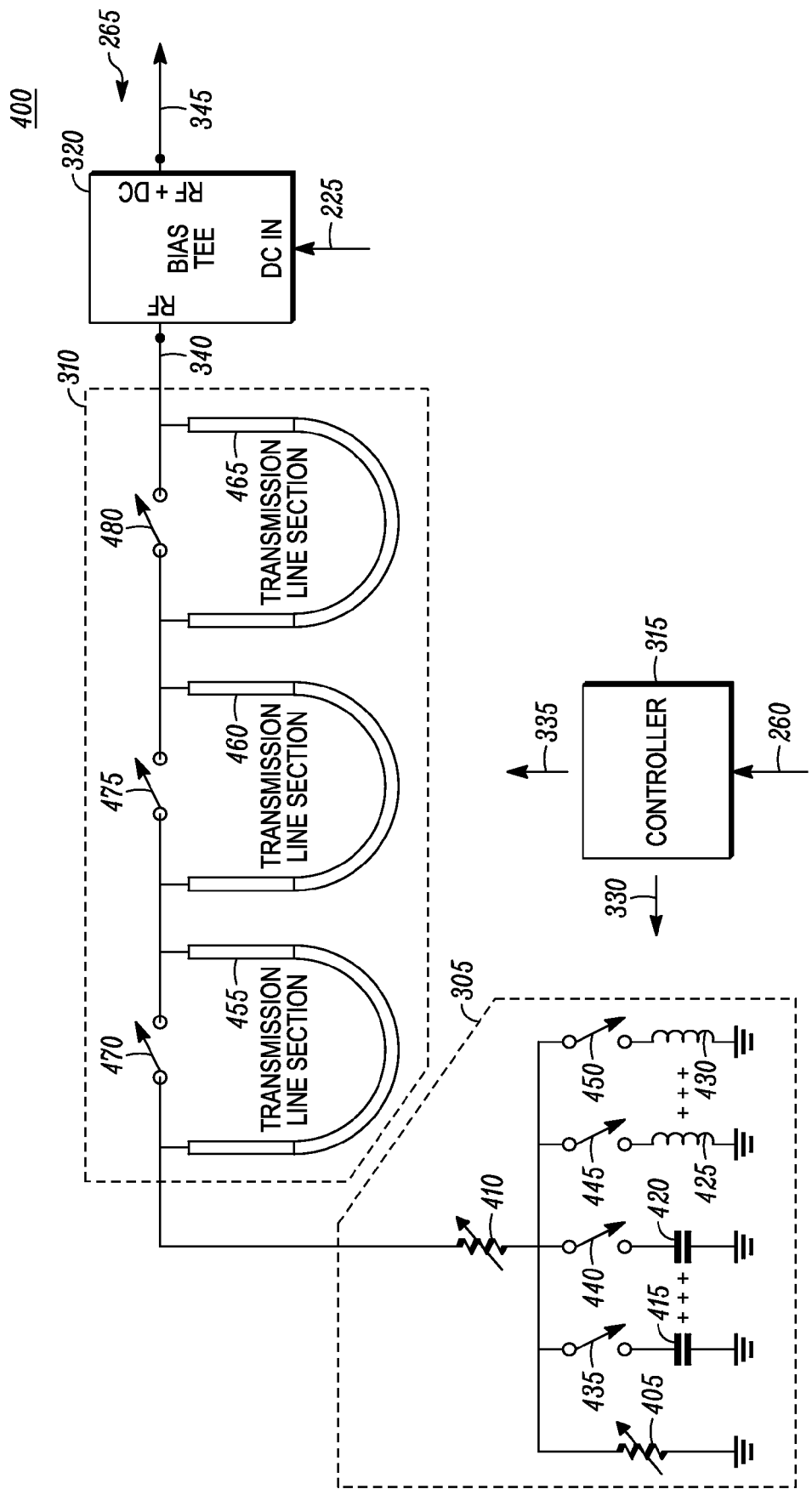
FIG. 4 is an exemplary schematic of an impedance network, utilized in accordance with certain embodiments of the present invention.

Refer to FIG. 4, which is an exemplary schematic 400 of an impedance network, utilized in accordance with certain embodiments of the present invention. Variable delay/phase 310 is configured as a series connection of three transmission line sections, transmission line section 455, transmission line section 460, and transmission line section 465, these being placed in or out of circuit by switch 470, switch 475, or switch 480, respectively. Switch 470, switch 475, and switch 480 are controlled by controller output 335. Controller output 335 may be digital or analog. Switches 470, 475, and 480 may be any device which provides electrical switching, such as a relay, a transistor, or a diode, and may be either active or passive. Variable impedance 305 is configured as an RLC circuit wherein the specific values of resistance, capacitance, and inductance are determined by controller output 330. Capacitor 415 is routed through switch 435, and capacitor 420 is routed through switch 440. Inductor 425 is routed through switch 445, and inductor 430 is routed through switch 450. Switch 435, switch 440, switch 445, and switch 450 are controlled by controller output 330. Resistive element 405 and resistive element 410 are controlled by controller output 330 (details not shown). Resistive element 410 is in series with the parallel combination of resistive element 405, any capacitor value selected, and any inductor value selected. The whole is an electrical network wherein the value of each component may be selected or modified. Note that resistive element 405 and resistive element 410 may be comprised of any device which functionally provides electrical resistance, such as resistors and semiconductor devices. Capacitor 415 and capacitor 420 may be comprised of any device which functionally provides electrical capacitance, such as capacitors and semiconductors. Inductor 425 and inductor 430 may be comprised of any device which functionally provides electrical inductance, such as inductors and certain electronics circuits. Switch 435, switch 440, switch 445, and switch 450 may be comprised of any device which functionally provides the required switching behavior. Operation of bias tee 320, Vcc 225, bias tee input 340, and bias tee output 345 are as described previously. Operation of controller 315 and impedance network control 260 are as described previously. Transformer center tap signals travel through a variable delay/phase 310, comprised of switched transmission line lengths, then through variable impedance 305 which is comprised of a matrix of switched or variable reactive and resistive elements. Using these elements a termination for even harmonics at the transformer primary center tap can be furnished at the active device outputs by allowing particular phase shifts and/or electrical delays at multiples of the desired fractional wavelength. The impedance produced by variable impedance 305 can be delivered to the reference plane of the active device output terminals through the selection of the electrical phase length of the variable delay block. This results in the desired impedance for the total reflection of the even harmonic energy. It is then reflected back into the active device where it will become available for use at the desired fundamental frequency.

Those of ordinary skill in the art will appreciate that many other circuit and variations of system configurations can be readily devised to accomplish the desired end without departing from the spirit of the present invention.

While the invention has been described in conjunction with specific embodiments, it is evident that many alternatives, modifications, permutations and variations will become apparent to those of ordinary skill in the art in light of the foregoing description. By way of example, other types of devices and circuits may be utilized for any component or circuit as long as they provide the requisite functionality. A further example is that the described circuitries may be implemented as part of an integrated circuit, or a hybrid circuit, or a discrete circuit, or combinations thereof. Yet another example is that the features of the present invention may be adapted to operate over a wide range of frequencies, up to and including high RF frequencies and odd-order harmonics. A further example is that impedance network control may be accomplished by manual or automatic means, to include software control. Accordingly, it is intended that the present invention embrace all such alternatives, modifications and variations as fall within the scope of the appended claims.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The invention claimed is:

1. A method of enhancing efficiency of a balanced amplifier, said method comprising:
providing controlled impedance terminations within the balanced amplifier at one or more harmonic frequencies of a fundamental frequency that is operable to mitigate the presence of harmonic energy content in the output signal of the balanced amplifier, wherein the controlled impedance terminations are determined at least in part by one or more programmable delays; and
reflecting the mitigated harmonic energy within the balanced amplifier, wherein the reflected harmonic energy is available for use by the balanced amplifier at the fundamental frequency and wherein the efficiency of the balanced amplifier is enhanced, and wherein the one or more programmable delays of the controlled impedance terminations are determined at least in part by one or more programmable RLC circuits.

2. The method of claim 1, wherein the harmonic energy is even harmonic energy.

3. The method of claim 1, wherein the controlled impedance terminations are programmable with one or more operating parameters of the balanced amplifier and wherein recovering the harmonic energy is dynamically optimized.

4. The method of claim 3, wherein the controlled impedance terminations are programmable to provide low impedances at the one or more harmonic frequencies to promote a strong reflection of the energy at each of the one or more harmonic frequencies.

5. The method of claim 3, wherein the controlled impedance terminations are programmable to provide high impedances at the one or more harmonic frequencies to promote a strong reflection of the energy at each of the one or more harmonic frequencies.

6. The method of claim 3, wherein the controlled impedance terminations are programmable to provide an operating impedance at the fundamental frequency.

7. The method of claim 1, wherein the controlled impedance terminations are physically positioned to optimize reflection of the harmonic energy.

8. The method of claim 7, wherein the controlled impedance terminations are physically positioned in proximity to the output terminals of a plurality of active power devices of the balanced amplifier.

9. A balanced amplifier, the balanced amplifier comprising:
a first input for receiving a first input signal;
a second input for receiving a second input signal;
a first active power device which amplifies first input signal;
a second active power device which amplifies second input signal;
a transformer primary which combines the output of first active power device and the output of second active power device, and having a transformer primary center tap;
an impedance network having an input coupled to DC supply and an output coupled to the transformer primary center tap, wherein the impedance network is operable to modify the impedances provided to the outputs of the first and second active power devices by providing controlled impedance terminations within the balanced amplifier at one or more harmonic frequencies of a fundamental frequency that is operable to mitigate the presence of harmonic energy content in the output signal of the balanced amplifier, wherein the controlled impedance terminations are determined at least in part by one or more programmable delays formed of one or more programmable RLC circuits.

10. The balanced amplifier of claim 9, wherein the impedance network is programmable to provide low impedances at the outputs of the first and second active power devices at harmonic frequencies.

11. The method of claim 9, wherein the controlled impedance terminations are programmable to provide high impedances at the one or more harmonic frequencies to promote a strong reflection of the energy at each of the one or more harmonic frequencies.

12. The balanced amplifier of claim 9, wherein the impedance network is programmable to provide an operating impedance at the fundamental frequency at the outputs of the first and second active power devices.

13. The balanced amplifier of claim 9, wherein the impedance network supplies operating voltage to the transformer primary center tap.

14. The balanced amplifier of claim 9, wherein the impedance network sets a plurality of impedances at a plurality of frequencies to outputs of the first and second active power devices.

15. The balanced amplifier of claim 9, wherein the impedances presented to the output of the first active power device and the output of the second active power device are caused to be substantially zero by the impedance network.

16. The balanced amplifier of claim 15, wherein the impedances are substantially zero at harmonic frequencies.

* * * * *